United States Patent [19]

Butcher et al.

[11] Patent Number: 5,382,865

[45] Date of Patent: Jan. 17, 1995

[54] COMPOSITE MULTILAYER CERAMIC STRUCTURE

[75] Inventors: Steven J. Butcher, Yarnton; James D. Hobby, Didcot; David H. M. Kings, Bicester, all of United Kingdom

[73] Assignee: Cookson Group PLC, London, United Kingdom

[21] Appl. No.: 30,222

[22] PCT Filed: Sep. 27, 1991

[86] PCT No.: PCT/GB91/01674

§ 371 Date: Mar. 26, 1993

§ 102(e) Date: Mar. 26, 1993

[87] PCT Pub. No.: WO92/06509

PCT Pub. Date: Apr. 16, 1992

[30] Foreign Application Priority Data

Sep. 28, 1990 [GB] United Kingdom ............... 9021122

[51] Int. Cl.6 ............................................. H01L 41/08
[52] U.S. Cl. ....................................... 310/366; 310/328
[58] Field of Search ............... 310/328, 366, 316, 323, 310/358

[56] References Cited

U.S. PATENT DOCUMENTS

| | | | |
|---|---|---|---|
| 3,590,287 | 6/1971 | Berlincourt et al. | 310/328 |
| 4,325,255 | 4/1982 | Howard et al. | 310/316 |
| 4,523,121 | 6/1985 | Takahashi et al. | 310/334 |
| 4,564,782 | 1/1986 | Ogawa | 310/358 |
| 4,667,127 | 5/1987 | Krempl et al. | 310/338 |
| 4,780,639 | 10/1988 | Shirasu | 310/328 |
| 4,833,358 | 5/1989 | Suzuki et al. | 310/316 |
| 5,118,982 | 6/1992 | Inoue et al. | 310/366 |
| 5,237,236 | 8/1993 | Culp | 310/317 |
| 5,241,236 | 8/1993 | Sasaki et al. | 310/358 |

FOREIGN PATENT DOCUMENTS

| | | | |
|---|---|---|---|
| 0165380 | 7/1987 | Japan | H01L 41/08 |
| 0066980 | 3/1988 | Japan | 310/316 |

*Primary Examiner*—Thomas M. Dougherty
*Attorney, Agent, or Firm*—Westman, Champlin & Kelly

[57] ABSTRACT

A composite multilayer ceramic structure which comprises in a single device a plurality of layers of an electrostrictive dielectric material separated by a plurality of electrode layers in which a first portion is adapted to operate as an electrostrictive actuator and a second portion, which is adjacent to the first portion and which is not inherently piezoelectric, is adapted to operate in the same way as a piezoelectric sensor.

10 Claims, 2 Drawing Sheets

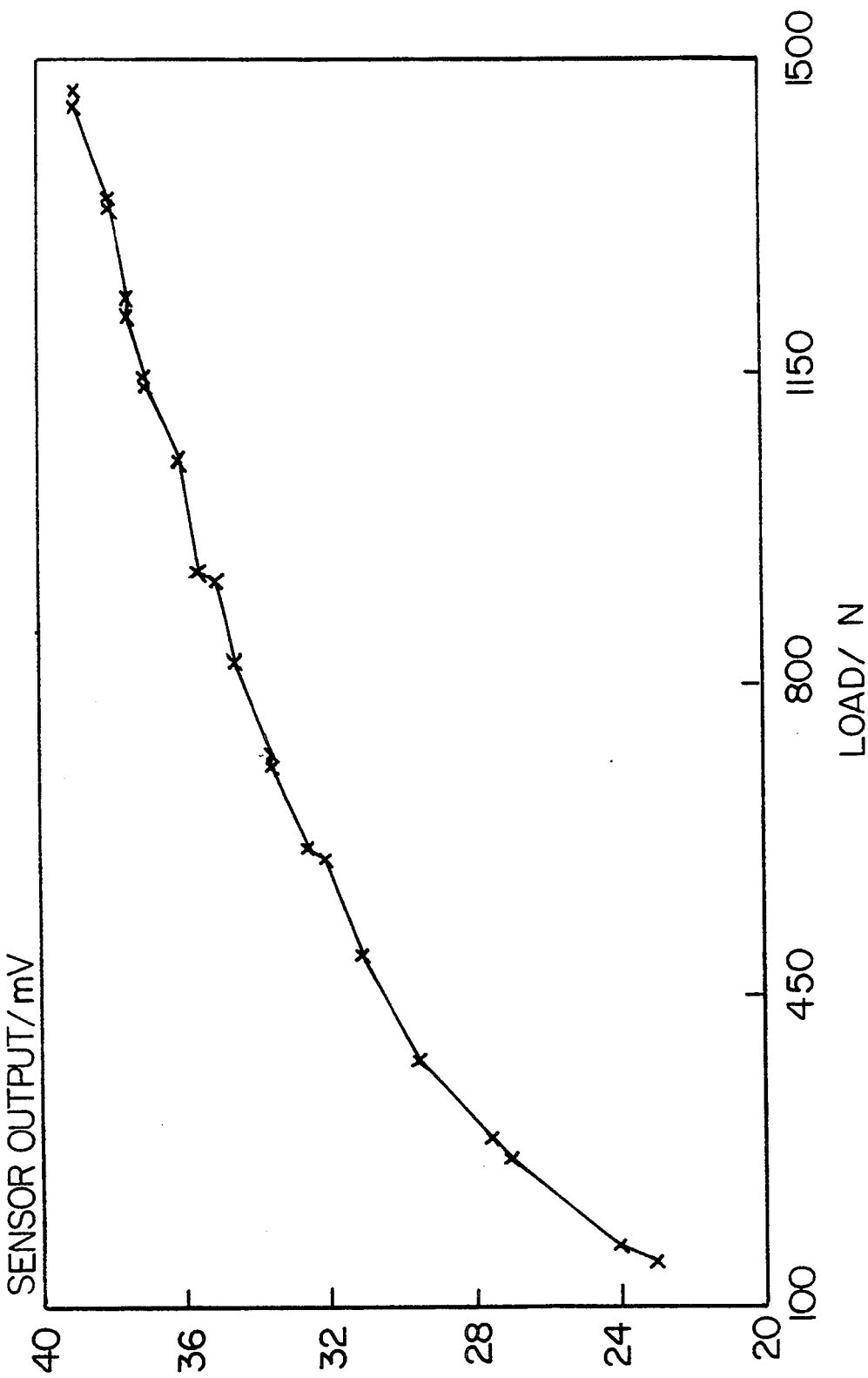

COMPOSITE MULTILAYER CERAMIC STRUCTURE

BACKGROUND OF THE INVENTION

The present invention relates to a composite multilayer ceramic structure and, in particular, to a controlled force or force limited multilayer ceramic actuator which comprises a combination of an electrostrictive actuator and sensor.

Multilayer ceramic actuators in which a plurality of layers of a dielectric material are separated by a plurality of electrode layers are known in the art. We have now developed a composite multilayer ceramic structure in which a multilayer electrostrictive ceramic actuator is combined with a sensor in a single device.

SUMMARY OF THE INVENTION

Accordingly, the present invention provides a composite multilayer ceramic structure which comprises a plurality of layers of an electrostrictive dielectric material separated by a plurality of electrode layers in which a first portion is adapted to operate as an electrostrictive actuator and a second portion, which is adjacent to the first portion and which is not inherently piezoelectric comprises means to apply a biased voltage thereto whereby the second portion comprises means to apply a bias voltage thereto whereby it is adapted to operate in the same way as a piezoelectric sensor.

The composite multilayer ceramic structure of the present invention is a controlled force or force limited electrostrictive actuator which comprises a stack of a plurality of layers of an electrostrictive dielectric material separated by a plurality of electrode layers, alternate electrodes in a first portion of the stack being connected to positive or negative potential and means to apply a voltage thereto, alternate electrodes in a second portion of the stack being connected to positive or negative potential and means to apply a bias voltage thereto, means to measure the charge produced by the second portion of the stack and means to adjust the voltage applied to the first portion of the stack.

In the composite multilayer structure of the present invention the second portion adapted to operate as a sensor may be sandwiched between first and third portions which are adapted to operate as electrostrictive actuators.

The first portion, and the third portion of the composite composite multilayer ceramic structure when present, are adapted to operate as electrostrictive actuators.

The material which is used as the electrostrictive dielectric material in the different portions of the structure maybe the same or different, although it is preferred to use the same material. For example, the same dielectric material may be used for the different portions of the structure, providing that it is a material in which piezoelectricity can be induced by the application of a bias field.

The present invention also includes within its scope a method of producing a controlled force or force limited multilayer ceramic actuator which comprises forming a stack of a plurality of layers of an electrostrictive dielectric material separated by a plurality of electrode layers, operating a first portion of the stack as an electrostrictive actuator by connecting alternate electrodes in the first portion of the stack to positive or negative potential and applying a voltage thereto, and inducing piezoelectricity in a second portion of the stack by applying a bias field thereto so that it generates a charge which is proportional to the force produced by the actuator.

The charge, Q, generated by the sensor portion of the structure may be measured by conventional techniques. Measurement of the charge enables the force acting on the sensor portion of the structure to be determined and the force applied by the electrostrictive actuator may be controlled or limited by varying the voltage which is applied to the first (and optionally third) portion(s) of the stack.

The controlled force or force limited actuator of the present invention may be used in mechanised devices, such as precision robots.

BRIEF DESCRIPTION OF THE DRAWINGS

The present invention will be further described with reference to the accompanying drawing in which:

FIG. 2 is a graph in which the output of the sensor portion of a device according to the invention is plotted as a function of the applied load.

DETAILED DESCRIPTION OF THE PREFERRED EMBODIMENTS

Figure 1:
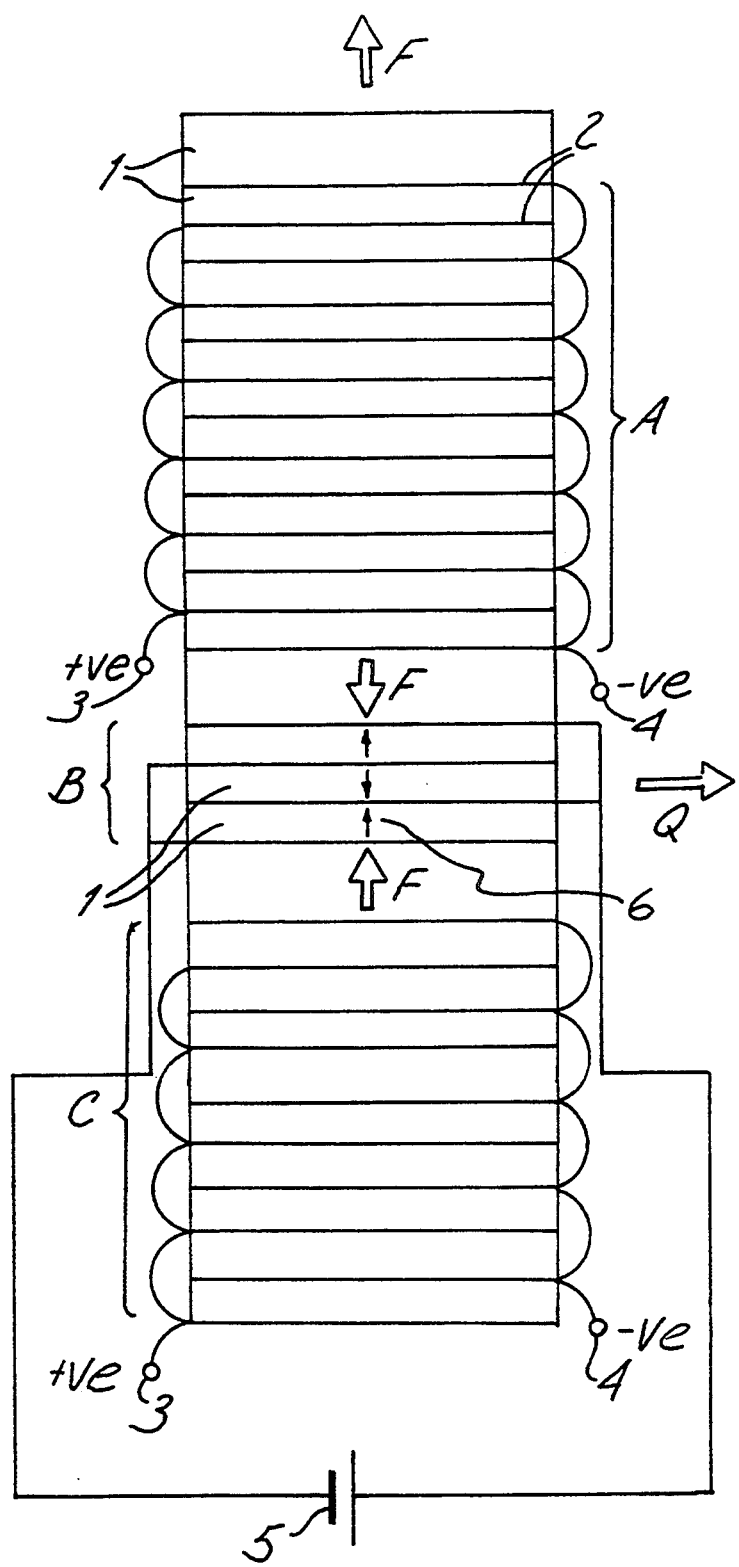
FIG. 1 is a diagram of a multilayer ceramic structure in accordance with the invention which is formed from a single electrostrictive ceramic material.

Referring to FIG. 1, the actuator comprises a plurality of layers of the same dielectric material 1 which are separated by a plurality of electrode layers 2. The structure, as shown, is essentially divided into two portions, the first portion A operating as an electrostrictive actuator whilst the second portion B acts as a piezoelectric sensor. Alternate electrodes in portion A are connected together to a positive potential 3 or a negative potential 4. A voltage is thereby applied to the electrostrictive portion A of the structure. The application of a voltage across the electrostrictive portion A of the structure produces strain and generates force which is indicated by the arrows F on the figure. The alternate electrodes of the portion of the structure B are connected to a bias voltage source 5 and a bias voltage applied thereto. The bias field induces piezoelectricity and induced piezoelectric dipoles 6 are shown by the arrows in the Figure. The piezoelectric sensor portion B of the structure is thereby placed under stress and generates an electric charge Q which is measured by conventional means, not shown. Measurement of the charge Q enables determination of the force F acting on the piezoelectric sensor portion B of the structure, thus allowing the force applied by the actuator portion A of the structure to be controlled or limited by varying the voltage applied thereto.

FIG. 2 is a graph in which the output of the sensor portion of a device as described with reference to FIG. 1 was plotted as a function of the applied load. The sensor portion of the device comprised 10 layers, the thickness of the dielectric layers being 125 micrometers and the thickness of the electrode layers being 10 micrometers. The area of each layer of the device was 10×9 mm. The D.C. voltage (bias voltage) was 30 V.

The output signal is suitable for use in a standard feedback circuit, enabling the combined device to be used to control or limit the load which it applies.

The second portion B can, in one preferred embodiment, be sandwiched by first portion A and third portion C, shown in FIG. 1. Third portion C, is arranged, as first portion A, to operate as an electrostrictive actuator.

We claim:

1. A composite multilayer ceramic structure which comprises in a single device a plurality of layers of an electrostrictive dielectric material separated by a plurality of electrode layers in which a first portion is adapted to operate as an electrostrictive actuator and a second portion is adapted to operate as a sensor, the second portion, which is adjacent to the first portion and which is not inherently piezoelectric, comprises means to apply a bias voltage thereto, whereby the second portion is adapted to operate in the same way as a piezoelectric sensor, there being substantially no macroscopic remnant polarization in the second portion when the bias voltage is removed therefrom.

2. A composite multilayer ceramic structure as claimed in claim 1 wherein the second portion is positioned between the first portion and a third portion, the first and third portions being adapted to operate as electrostrictive actuators.

3. A composite multilayer ceramic structure as claimed in claim 1 wherein the same dielectric material is used in the first and second portions.

4. A composite multilayer ceramic structure as claimed in claim 1 wherein different electrostrictive dielectric materials are used for the first portion adapted to operate as an electrostrictive actuator, and the second portion adapted to operate in the same way as a piezoelectric sensor.

5. A method of producing a controlled force or force limited multilayer ceramic electrostrictive actuator which comprises the steps of:

forming a stack of a plurality of layers of an electrostrictive dielectric material separated by a plurality of electrode layers;

operating a first portion of the stack as an electrostrictive actuator by connecting alternate electrodes in the first portion of the stack to positive or negative potential and applying a voltage thereto; and inducing piezoelectricity in a second portion of the stack by applying a bias field thereto so that it generates a charge which is proportional to the force produced by the actuator, the second portion having substantially no macroscopic remnant polarization when the bias field is removed therefrom.

6. A method as claimed in claim 5 wherein the same dielectric material is used in the first and second portions of the stack.

7. A method as claimed in claim 5 wherein the force applied by the electrostrictive actuator is controlled by varying the voltage which is applied to the first portion of the stack.

8. A controlled force or force limited multilayer ceramic electrostrictive actuator comprising:

a stack of a plurality of layers of an electrostrictive dielectric material separated by a plurality of electrode layers, a first portion of the stack comprises alternate electrodes connected to positive or negative potential, and means for applying a voltage thereto, and a second portion of the stack comprises alternate electrodes connected to positive or negative potential, and means for applying a bias voltage thereto, the second portion being substantially free of macroscopic remnant polarization when the bias voltage is removed therefrom;

means for measuring the charge produced by the second portion of the stack; and means to adjust the voltage applied to the first portion of the stack.

9. A composite multilayer ceramic structure as claimed in claim 2 wherein the same dielectric material is used for the first, second and third portions.

10. A composite multilayer ceramic structure as claimed in claim 2 wherein different electrostrictive dielectric materials are used for the first and third portions adapted to operate as an electrostrictive actuator, and the second portion adapted to operate in the same way as a piezoelectric sensor.

* * * * *